United States Patent
Yang et al.

(10) Patent No.: US 11,926,271 B2
(45) Date of Patent: Mar. 12, 2024

(54) DETECTION CIRCUIT FOR INSTANTANEOUS VOLTAGE DROP AND ON-BOARD DIAGNOSTIC SYSTEM

(71) Applicant: ZTE Corporation, Shenzhen (CN)

(72) Inventors: Qian Yang, Shenzhen (CN); Jian Li, Shenzhen (CN); Jianhua Zhang, Shenzhen (CN); Jijie Shi, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 200 days.

(21) Appl. No.: 17/624,432

(22) PCT Filed: Apr. 13, 2020

(86) PCT No.: PCT/CN2020/084508
§ 371 (c)(1),
(2) Date: Jan. 3, 2022

(87) PCT Pub. No.: WO2021/031584
PCT Pub. Date: Feb. 25, 2021

(65) Prior Publication Data
US 2022/0363208 A1 Nov. 17, 2022

(30) Foreign Application Priority Data
Aug. 22, 2019 (CN) .......................... 201910777986.6

(51) Int. Cl.
*B60R 16/023* (2006.01)
*G01R 19/165* (2006.01)
*G01R 31/00* (2006.01)

(52) U.S. Cl.
CPC .... *B60R 16/0232* (2013.01); *G01R 19/16542* (2013.01); *G01R 31/006* (2013.01)

(58) Field of Classification Search
CPC .......... B60R 16/0232; G01R 19/16542; G01R 31/006; G01R 19/0038; G01R 17/02;
(Continued)

(56) References Cited

U.S. PATENT DOCUMENTS

| 4,260,907 A | 4/1981 | Winebarger |
| 4,803,416 A | 2/1989 | Abiven |

(Continued)

FOREIGN PATENT DOCUMENTS

| CN | 1012903332 A | 10/2008 |
| CN | 106499561 A | 3/2017 |

(Continued)

OTHER PUBLICATIONS

International Search Report for corresponding application PCT/CN2020/084508 filed Apr. 13, 2020; dated Jul. 3, 2020.
(Continued)

*Primary Examiner* — Daniel R Miller
(74) *Attorney, Agent, or Firm* — CANTOR COLBURN LLP

(57) ABSTRACT

A detection circuit for instantaneous voltage drop and an on-board diagnostic system. The detection circuit comprises two RC circuits, each of the RC circuits comprises a first resistor, a second resistor, and an energy storage capacitor; a first end of the first resistor is used for receiving a to-be-detected voltage, and a second end thereof is connected to a first end of the second resistor; the energy storage capacitor is connected in parallel with the second resistor; the first end of the second resistor forms an output end of the RC circuit, and the output end is connected to an input end of the comparator; an output end of the comparator is connected to the determination unit; in the two RC circuits,
(Continued)

the resistance ratios of the second resistors to the first resistors are different, the capacitances of the energy storage capacitors are different.

18 Claims, 5 Drawing Sheets

(58) Field of Classification Search
CPC ..... G01R 19/165; Y02T 10/40; G07C 5/0808; G08B 21/182
See application file for complete search history.

(56) References Cited

U.S. PATENT DOCUMENTS

| | | | |
|---|---|---|---|
| 4,912,774 A * | 3/1990 | Saito | H02H 3/247 |
| | | | 455/127.1 |
| 4,982,443 A * | 1/1991 | Komoda | G01R 19/16542 |
| | | | 455/127.1 |
| 6,166,547 A | 12/2000 | De La Rosa | |
| 7,034,515 B2 | 4/2006 | Shimoe | |
| 8,498,172 B1 * | 7/2013 | Patton, III | G11C 5/143 |
| | | | 365/226 |
| 2003/0112027 A1 | 6/2003 | Muhtaroglu | |
| 2005/0194929 A1 | 9/2005 | Funabashi | |
| 2005/0218972 A1 | 10/2005 | Hazucha | |
| 2007/0288182 A1 * | 12/2007 | Douriet | G06F 1/305 |
| | | | 713/340 |
| 2009/0063884 A1 | 3/2009 | Weekly | |
| 2014/0266104 A1 | 9/2014 | El-Nozahi | |
| 2019/0212395 A1 * | 7/2019 | Chen | H01M 10/486 |

FOREIGN PATENT DOCUMENTS

| | | |
|---|---|---|
| CN | 207504562 U | 6/2018 |
| JP | 06245396 A * | 9/1994 |
| JP | 677448 A | 10/1994 |

OTHER PUBLICATIONS

European Search Report for corresponding application EP 20 85 5013: Report dated Sep. 22, 2022.

* cited by examiner

DETECTION CIRCUIT FOR INSTANTANEOUS VOLTAGE DROP AND ON-BOARD DIAGNOSTIC SYSTEM

CROSS-REFERENCE TO RELATED APPLICATION

The present disclosure is proposed on the basis of Chinese Patent Application No. 201910777986.6 and filed on Aug. 22, 2019, and claims priority to the Chinese Patent Application, the disclosure of which is incorporated herein by reference in its entirety.

TECHNICAL FIELD

Embodiments of the present disclosure relate to the technical field of detection, and in particular, to a detection circuit for instantaneous voltage drop and an on-board diagnostic system.

BACKGROUND

Regarding an on-board diagnostics (OBD for short) system, the system is used for monitoring the operating condition of an engine and the operating state of an exhaust post-treatment system at any time. Once it is found that an excessive emission situation possibly occurs, a warning is sent immediately. For example, the OBD can monitor, in real time, operating data such as whether a vehicle is ignited, whether the vehicle is speeding and whether the fuel consumption is excessively high, and can analyze whether a fault occurs. If the system fails, a fault light or an engine-checking warning light is turned on; and the OBD system stores the fault information in a memory, and related information may be read in the form of fault codes by means of a standard diagnostic instrument and diagnostic interface. According to prompt of the fault codes, a maintenance personnel can quickly and accurately determine the nature and position of the fault. The OBD ensures the safety of travel of the vehicle, and records conditions of the vehicle.

SUMMARY

Embodiments of the present disclosure provide a detection circuit for instantaneous voltage drop and an on-board diagnostic system.

Embodiments of the present disclosure provide a detection circuit for instantaneous voltage drop, comprising: two RC circuits, a comparator and a determination unit; each RC circuit comprises a first resistor, a second resistor and an energy storage capacitor; a first end of the first resistor is configured to receive a to-be-detected voltage, a second end of the first resistor is connected to a first end of the second resistor, and a second end of the second resistor is grounded; the energy storage capacitor is connected in parallel with the second resistor; the first end of the second resistor forms an output end of the RC circuit; the output ends of the two RC circuits are correspondingly connected to two input ends of the comparator, respectively; an output end of the comparator is connected to the determination unit; wherein in the two RC circuits, resistance ratios of the second resistors to the first resistors are different, capacitances of the energy storage capacitors are different, and the capacitance of the energy storage capacitor in the RC circuit with a larger resistance ratio of the second resistor to the first resistor is smaller; and the determination unit is configured to determine that the to-be-detected voltage drops instantaneously when it is at least detected that the comparator is inverted.

Embodiments of the present disclosure further provide an on-board diagnostic system, comprising: the described detection circuit for instantaneous voltage drop.

BRIEF DESCRIPTION OF THE DRAWINGS

Exemplary illustrations are made on one or more embodiments by means of figures in the accompanying drawings corresponding thereto, and these exemplary illustrations are not intended to constitute limitation on the embodiments. Elements having the same reference numerals in the drawings are designated as like elements, and unless otherwise specified, the figures in the drawings are not intended to constitute limiting.

DETAILED DESCRIPTION OF THE EMBODIMENTS

To make the objects, technical solutions, and advantages of the embodiments of the present disclosure clearer, hereinafter, embodiments of the present disclosure will be described in detail in combination with the accompanying drawings. However, a person of ordinary skill in the art may understand that in the embodiments of the present disclosure, many technical details are proposed to enable a reader to better understand some embodiments of the present disclosure. However, even without these technical details, based on various changes and modifications of the following embodiments, the technical solutions of some embodiments of the present disclosure can also be achieved. Dividing of the following embodiments is for convenience of description, and shall not constitute any limitation to specific implementations of some embodiments of the present disclosure. The embodiments may be referred to each other and combined with each other without any contradiction.

A first embodiment of the present disclosure relates to a detection circuit for instantaneous voltage drop, which can be applied to voltage detection in any scenarios where a voltage may drop instantaneously; for example, when a vehicle is ignited, the voltage of a power source for supplying power to an ignition device will drop instantaneously, and therefore the circuit of some embodiments of the present disclosure can be used for detecting whether the vehicle is ignited. However, the scenarios are not limited in this embodiment. The detection circuit for instantaneous voltage drop in some embodiments of the present disclosure can be applied to any scenarios in which it is required to detect whether a voltage drops instantaneously.

Figure 1:
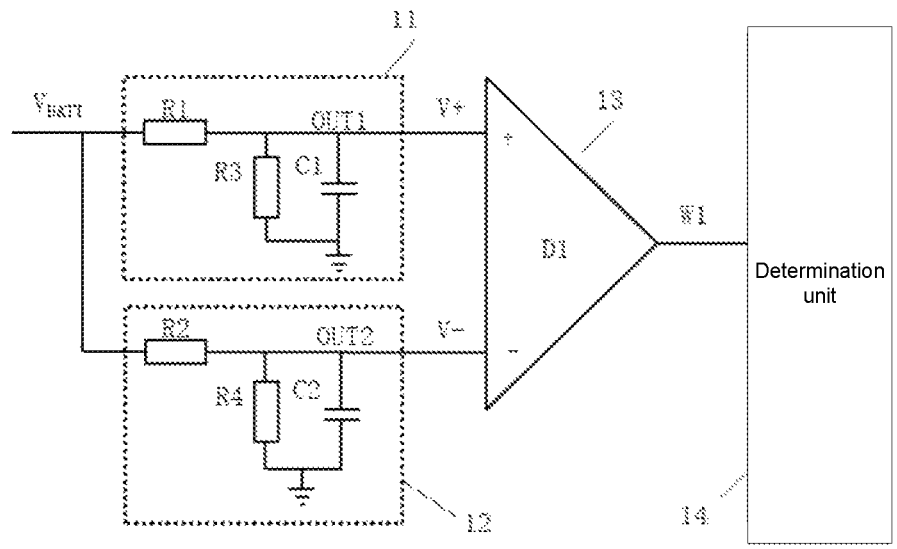
FIG. 1 is a schematic diagram of a detection circuit for instantaneous voltage drop according to a first embodiment of the present disclosure.

As shown in FIG. 1, the detection circuit for instantaneous voltage drop comprises: two RC circuits, a comparator 13 and a determination unit 14, the two RC circuits being respectively denoted as a first RC circuit 11 and a second RC circuit 12. Each RC circuit comprises a first resistor, a second resistor and an energy storage capacitor. For ease of description, in this embodiment, the first resistors in the two RC circuits are respectively denoted by reference signs R1 and R2, and hereinafter are respectively referred to as a resistor R1 and a resistor R2 for short; the second resistors in the two RC circuits are respectively denoted by reference signs R3 and R4, and hereinafter are respectively referred to as a resistor R3 and a resistor R4 for short; and the energy storage capacitors in the two RC circuits are respectively denoted by reference signs C1 and C2, and hereinafter are respectively referred to as a capacitor C1 and a capacitor C2 for short.

Specifically, in the first RC circuit 11, a first end of the resistor R1 is used for receiving a to-be-detected voltage VBATT, a second end of the resistor R1 is connected to a first end of the resistor R3, and a second end of the resistor R3 is grounded; the capacitor C1 is connected in parallel with the resistor R3; and a first end of the resistor R3 forms an output end OUT1 of the first RC circuit 11. In the second RC circuit 12, a first end of the resistor R2 is used for receiving the to-be-detected voltage VBATT, a second end of the resistor R2 is connected to a first end of the resistor R4, and a second end of the resistor R4 is grounded; the capacitor C2 is connected in parallel with the resistor R4; and a first end of the resistor R4 forms an output end OUT2 of the second RC circuit 12. Output ends OUT1 and OUT2 of the two RC circuits are correspondingly connected to two input ends of the comparator 13 respectively, and an output end of the comparator 13 is connected to the determination unit 14.

In the present embodiment, the resistance ratios of the second resistors to the first resistors in the two RC circuits are different, which means that the resistance ratio of the resistor R3 to the resistor R1 in the first RC circuit 11 is different from the resistance ratio of the resistor R4 to the resistor R2 in the second RC circuit 12. In the first RC circuit 11, both the resistor R1 and the resistor R3 have a voltage division function, and the voltage outputted by the output end OUT1 is the voltage across two ends of the resistor R3; and by the same reasoning, in the second RC circuit 12, the voltage outputted by the output end OUT2 is the voltage across two ends of the resistor R4. The to-be-detected voltage VBATT is inputted to both the first end of the resistor R1 and the first end of the resistor R2, that is, input voltages of the first RC circuit 11 and the second RC circuit 12 are the same. The resistance ratio of the resistor R3 to the resistor R1 is different from the resistance ratio of the resistor R4 to the resistor R2, which indicates that when the input voltages of the first RC circuit 11 and the second RC circuit 12 are the same, the voltage allocated to the resistor R3 in the first RC circuit 11 is different from the voltage allocated to the resistor R4 in the second RC circuit 12. Therefore, voltages received by the two input ends of the comparator 13 are also different.

In the present embodiment, the capacitances of the energy storage capacitors in the two RC circuits are different, which means that the capacitance of the capacitor C1 in the first RC circuit 11 is different from the capacitance of the capacitor C2 in the second RC circuit 12. Therefore, an RC discharge curve of the first RC circuit 11 is different from an RC discharge curve of the second RC circuit 12, that is, during discharging, the RC circuit with a larger capacitor capacitance discharges faster.

In the present embodiment, the capacitance of the energy storage capacitor in the RC circuit with a larger resistance ratio of the second resistor to the first resistor is less, which means that if the resistance ratio of the resistor R3 to the resistor R1 in the first RC circuit 11 is greater than the resistance ratio of the resistor R4 to the resistor R2 in the second RC circuit 12, the capacitance of the energy storage capacitor in the first RC circuit 11 is less than the capacitance of the energy storage capacitor in the second RC circuit 12; and if the resistance ratio of the resistor R3 to the resistor R1 in the first RC circuit 11 is less than the resistance ratio of the resistor R4 to the resistor R2 in the second RC circuit 12, the capacitance of the energy storage capacitor in the first RC circuit 11 is greater than the capacitance of the energy storage capacitor in the second RC circuit 12.

The determination unit 14 is configured to determine that the to-be-detected voltage drops instantaneously upon detection that the comparator 13 is inverted. In this embodiment, the determination unit 14 may be a processing chip, for example, a main control chip of the on-board diagnostic system where the ignition device is located. However, the present disclosure is not limited thereto, and the determination unit 14 may also be implemented by a hardware circuit.

As shown in the example of FIG. 1, the output end OUT1 of the first RC circuit 11 is connected to a non-inverting input end of the comparator 13, and the output end OUT2 of the second RC circuit 12 is connected to an inverting input end of the comparator 13; and the resistance ratio of the resistor R3 to the resistor R1 is less than the resistance ratio of the resistor R4 to the resistor R2, and the capacitance of the capacitor C1 is greater than the capacitance of the capacitor C2.

Figure 2:
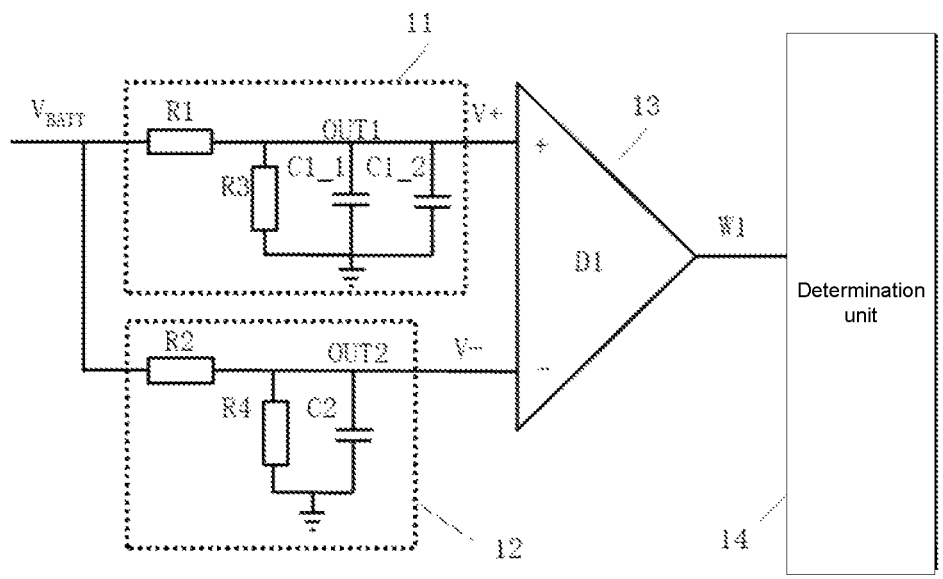
FIG. 2 is a schematic diagram of a modification structure of the detection circuit according to the first embodiment of the present disclosure.

In an example, in order to facilitate the selection of resistors and capacitors in production and manufacturing, as shown in FIG. 2, the capacitor C1 may be designed as a first sub-capacitor C1_1 and a second sub-capacitor C1_2 connected in parallel, wherein the capacitance of the first sub-capacitor C1-1 is the same as the capacitance of the capacitor C2, so as to satisfy that the capacitance of the capacitor C1 is greater than the capacitance of the capacitor C2. Moreover, the resistor R3 and the resistor R4 may be set as two resistors having the same resistance value, and the resistance value of the resistor R1 is greater than the resistance value of the resistor R2, so as to satisfy that the resistance ratio of the resistor R3 to the resistor R1 is less than the resistance ratio of the resistor R4 to the resistor R2. Values of various resistors and capacitors can be for example, R1=100 ohms, R2=90 ohms, R3=R4=30 ohms, C1_1=C2=0.1 microfarads, and C1_2=10 microfarads; wherein the capacitance of the capacitor C1_2 may be much greater than the capacitance of the capacitor C1_1, so that the drop speed of the voltage outputted by the output end OUT1 is greatly decreased relative to the drop speed of the voltage outputted by the output end OUT2.

Hereinafter, the operation principle of the detection circuit in FIG. 1 is described in detail.

The resistance ratio of the resistor R3 to the resistor R1 is less than the resistance ratio of the resistor R4 and the resistor R2, and input voltages of the first RC circuit 11 and the second RC circuit 12 are both the to-be-detected voltage VBATT, and thus the voltage allocated to the resistor R3 in the first RC circuit 11 is less than the voltage allocated to the resistor R4 in the second RC circuit 12. The voltage V+ received by the non-inverting input end of the comparator 13 is the voltage outputted by the output end OUT1, and the voltage V− received by the inverting input end of the comparator is the voltage outputted by the output end OUT2, and thus when the vehicle is not ignited, that is, when the to-be-detected voltage VBATT is in a steady state, the voltage V+ received by the non-inverting input end of the comparator 13 is less than the voltage V− received by the inverting input end, and thus an output voltage W1 of an output end of the comparator 13 is a low-level signal, as shown in FIG. 3.

Figure 3:
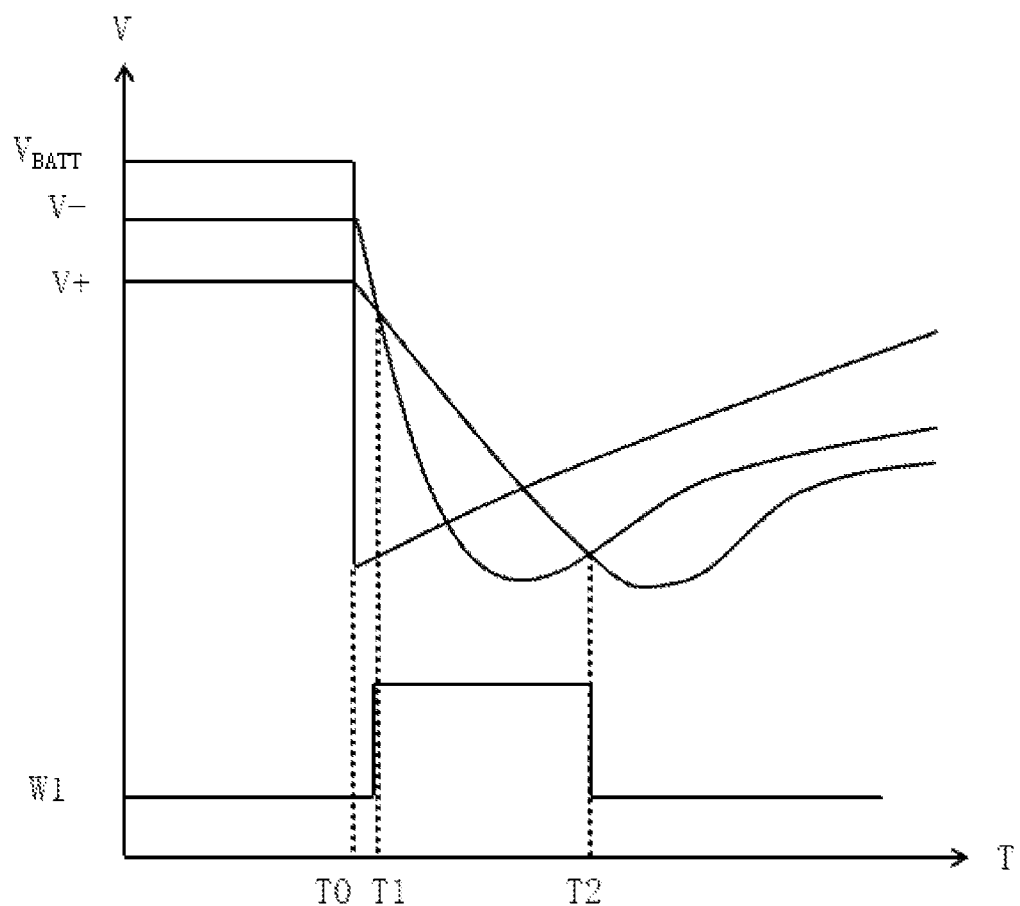
FIG. 3 is a schematic diagram illustrating change of voltages received by two input ends of a comparator according to one example of the first embodiment of the present disclosure.

When the vehicle is ignited, that is, time T0 in FIG. 3, the to-be-detected voltage VBATT instantaneously drops, the voltage across both ends of the resistor R3 and the voltage across both ends of the resistor R4 drop quickly, but due to the effect of discharging of capacitors connected in parallel with the resistors, the drop speed of the voltage across both ends of the resistor R3 and the drop speed of the voltage across both ends of the resistor R4 will slow down. The capacitance of the capacitor C1 is greater than the capacitance of the capacitor C2, and thus before the vehicle is ignited, the quantity of electric charge stored in the capacitor C1 is greater than the quantity of electric charge stored in the capacitor C2, and the discharge duration of the capacitor C1 is longer than the discharge duration of the capacitor C2. Therefore, the drop speed of the voltage across two ends of the resistor R3 is slower than the drop speed of the voltage across two ends of the resistor R4, and the drop speed of the voltage V+ received by the non-inverting input end of the comparator 13 is less than the drop speed of the voltage V− received by the inverting input end, so that starting from time T1 as shown in FIG. 3, the voltage V+ received by the non-inverting input end of the comparator 13 is greater than the voltage V− received by the inverting input end, and at this time, the output voltage W1 of the output end OUT of the comparator 13 is a high-level signal, that is, the comparator 13 is inverted. Upon detection that the comparator 13 is inverted, the determination unit 14 can determine that the to-be-detected voltage VBATT drops instantaneously, that is, the vehicle is ignited.

After the ignition is completed, the voltage of a power supply source of the ignition device will increase, that is, the to-be-detected voltage VBATT will increase back to a steady state, and therefore the voltages outputted by the output end OUT1 and the output end OUT2 will also slowly increase and tend to a steady state, and the voltage (i.e., the voltage V+ received by the non-inverting input end of the comparator 13) outputted by the output end OUT1 will be less than the voltage (i.e., the voltage V− received by the inverting input end of the comparator 13) outputted by the output end OUT2 again. As shown by time T2 in FIG. 3, this time represents a time at which the voltage V+ recovers to be less than the voltage V−, and at this time, the output voltage W1 of the output end of the comparator 13 is a low-level signal.

Figure 4:
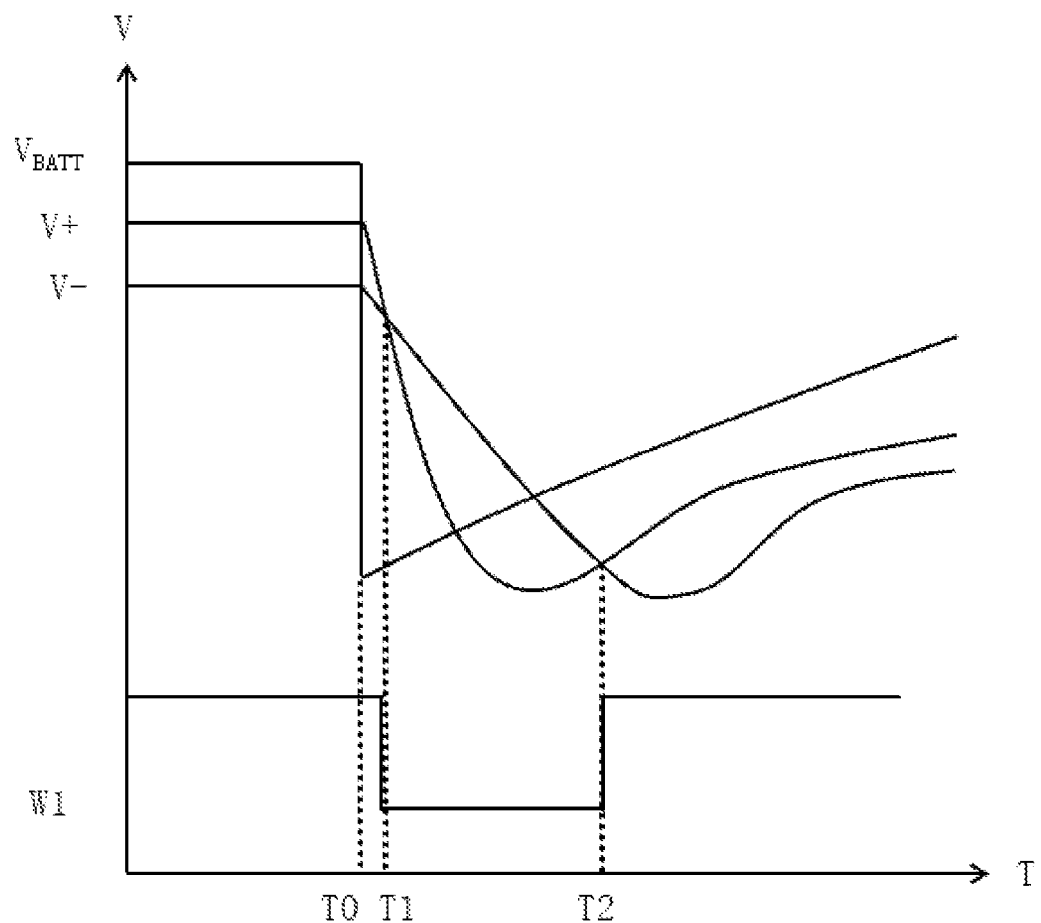
FIG. 4 is a schematic diagram illustrating change of voltages received by two input ends of the comparator according to another example of the first embodiment of the present disclosure.

In another example, the output end OUT1 of the first RC circuit 11 is connected to the inverting input end of the comparator 13, the output end OUT1 of the second RC circuit 12 is connected to the non-inverting input end of the comparator 13, and all the resistance values of the resistors and the capacitances of the capacitors are the same as those in the example in FIG. 3, and then the implementation principle thereof is substantially the same as that of the example in FIG. 3, and the difference merely lies in that: as shown in FIG. 4, when the vehicle is not ignited, that is, the to-be-detected voltage VBATT is in a steady state, the voltage V− received by the inverting input end of the comparator 13 is less than the voltage V+ received by the non-inverting input end of the comparator 13, and thus the output voltage W1 of the output end of the comparator 13 is a high-level signal; and in the T1-T2 time period after the ignition of the vehicle, the voltage V− received by the inverting input end of the comparator 13 is greater than the voltage V+ received by the non-inverting input end of the comparator 13, and the output voltage W1 of the output end of the comparator 13 is a low-level signal, that is, the comparator is inverted. Upon detection that the comparator 13 is inverted, the determination unit 14 can determine that the to-be-detected voltage VBATT drops instantaneously, that is, the vehicle is ignited. After the ignition is completed, the to-be-detected voltage VBATT increases to a steady state, that is, after the time T2, the output voltage W1 of the output end of the comparator 13 is a high-level signal.

In this embodiment, the resistance ratios of the second resistors to the first resistors in the two RC circuits are different, and thus after voltage division, the magnitudes of the voltages inputted to the two input ends of the comparator are different, and their relative magnitude remains unchanged in the steady state; wherein the voltage inputted, to the comparator, by the RC circuit with a larger resistance ratio of the second resistor to the first resistor is larger. The capacitances of the energy storage capacitors in the two RC circuits are different, such that the discharge durations of the energy storage capacitors in the two RC circuits are different. Furthermore, the capacitance of the energy storage capacitor in the RC circuit with a larger resistance ratio of the second resistor to the first resistor is smaller, and thus when the to-be-detected voltage drops instantaneously, the discharge duration of the RC circuit inputting a larger voltage to the comparator is shorter, while the discharge duration of the RC circuit inputting a smaller voltage to the comparator is longer, such that at a certain time after the to-be-detected voltage drops instantaneously, the relative magnitude of the voltages inputted to the two input ends of the comparator changes, and thus the comparator is inverted. Therefore, whether the to-be-detected voltage drops instantaneously can be determined on the basis whether the comparator is inverted. Furthermore, the detection circuit in some embodiments of the present disclosure has a simple structure, a small layout, low cost and a high detection speed.

In detecting whether ignition occurs, upon detection that the comparator is inverted, it can be determined that the to-be-detected voltage drops instantaneously, that is, as shown in time T1 in FIGS. 3 and 4, it can be detected that the comparator is inverted. However, regarding the solution in the prior art in which battery voltages at different times are detected and it is determined that ignition occurs upon detection that the battery voltage at a later time is higher than the battery voltage at a previous time, because in the prior art, detecting that the battery voltage at a later time is higher refers to a time when the battery voltage will increase again after the ignition, that is, after the time T2 shown in FIGS. 3 and 4, while in some embodiments of the present disclosure, it can be determined that the comparator is inverted necessarily before the battery voltage increases again after the ignition, with respect to the prior art, in some embodiments of the present disclosure, whether ignition occurs can be detected more timely, having better timeliness.

Figure 5:
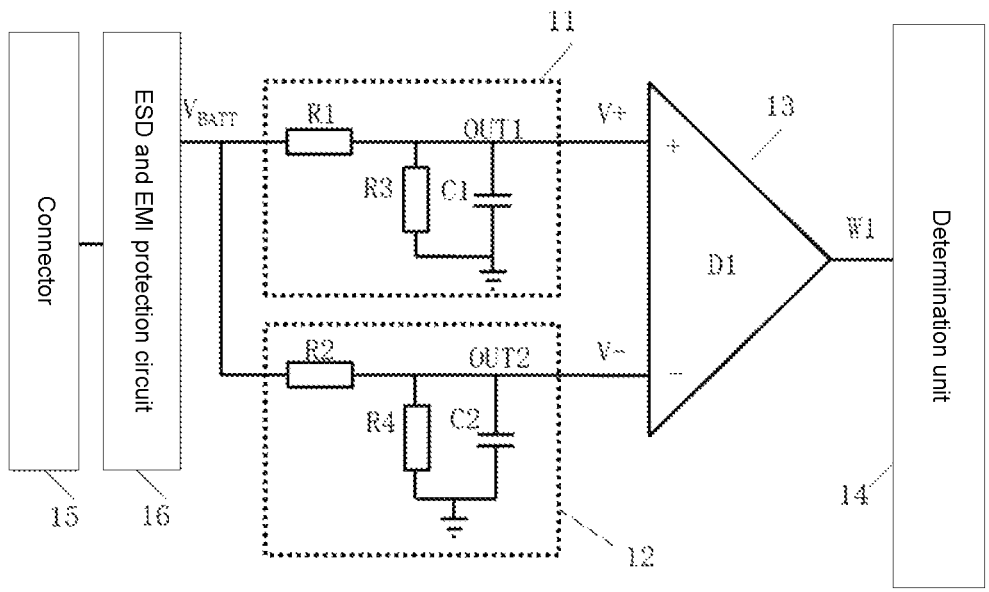
FIG. 5 is a schematic diagram of a circuit comprising a connector and an ESD and EMI protection circuit according to the first embodiment of the present disclosure.

In addition, the circuit in this embodiment can further comprise a connector 15. As shown in FIG. 5, the connector 15 is configured to acquire the to-be-detected voltage VBATT from a power source and input the to-be-detected voltage VBATT into the two RC circuits. When the circuit according to this embodiment is used for detecting whether a vehicle is ignited, the to-be-detected voltage VBATT needs to be acquired from the power supply source of the ignition device, and the connector 15 is, for example, an OBD interface of the vehicle. The type of the connector 15 needs to be set. In addition, the circuit in this embodiment can further comprise an ESD (electrostatic) and EMI (electromagnetic) protection circuit 16, provided between the connector 15 and the RC circuits, and functioning to isolate electrostatic and electromagnetic interferences.

A second embodiment of the present disclosure relates to a detection circuit for instantaneous voltage drop. The second embodiment is substantially the same as the first embodiment, and the main difference lies in that: in the second embodiment of the present disclosure, as shown in FIG. 6, the detection circuit further comprises two diodes VT1 and VT2, and the first ends of the first resistors in the two RC circuits are correspondingly connected to the two diodes respectively, so as to receive the to-be-detected voltage by means of the diodes.

Figure 6:
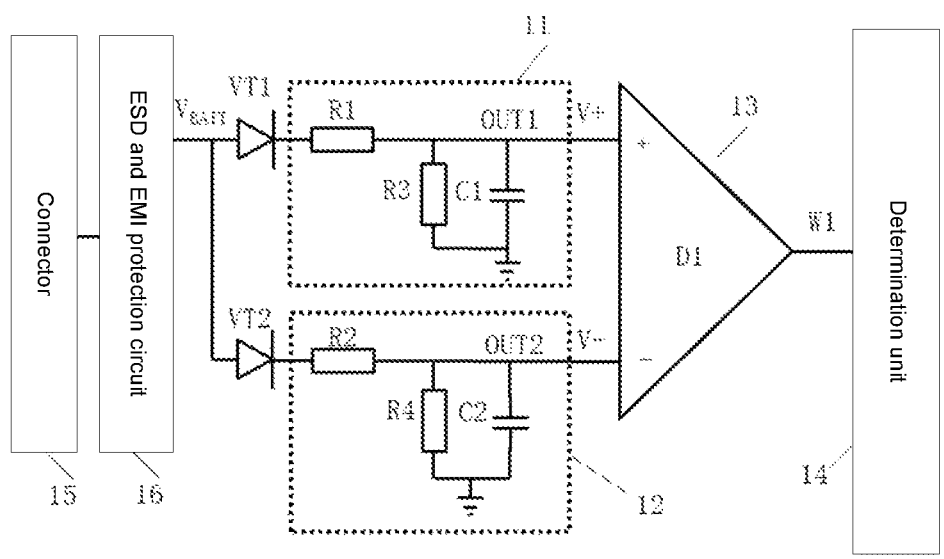
FIG. 6 is a schematic diagram of a detection circuit for instantaneous voltage drop according to a second embodiment of the present disclosure.

Specifically, a first end of the resistor 1 in the first RC circuit 11 is connected to a cathode of the diode VT1, and a first end of the resistor 2 in the second RC circuit 12 is connected to a cathode of the diode VT2; and anodes of the diodes VT1 and VT2 are both connected to the ESD and EMI protection circuit 16 in FIG. 6. It should be noted that FIG. 6 is an improvement based on FIG. 5, but it is not limited thereto. FIG. 6 may also be an improvement based on FIG. 1 or FIG. 2, that is, In the case that the connector 15 and the ESD and EMI protection circuit 16 do not need to be provided, anodes of the diodes VT1 and VT2 may be directly connected to a positive electrode of the power source so as to acquire the to-be-detected voltage VBATT.

In this embodiment, the diodes additionally provided between the RC circuits and a battery power source which outputs the to-be-detected voltage VBATT not only can prevent a rear-end current from flowing backward and damaging the battery power source, but also can prevent the detection circuit in some embodiments of the present disclosure from being damaged due to a wiring error between the battery power source and the detection circuit, thereby greatly improving the product safety. The wiring error is, for example, connecting a negative electrode of the power source to the first end of the resistor R1 and the first end of the resistor R2 in the RC circuits.

Figure 7:
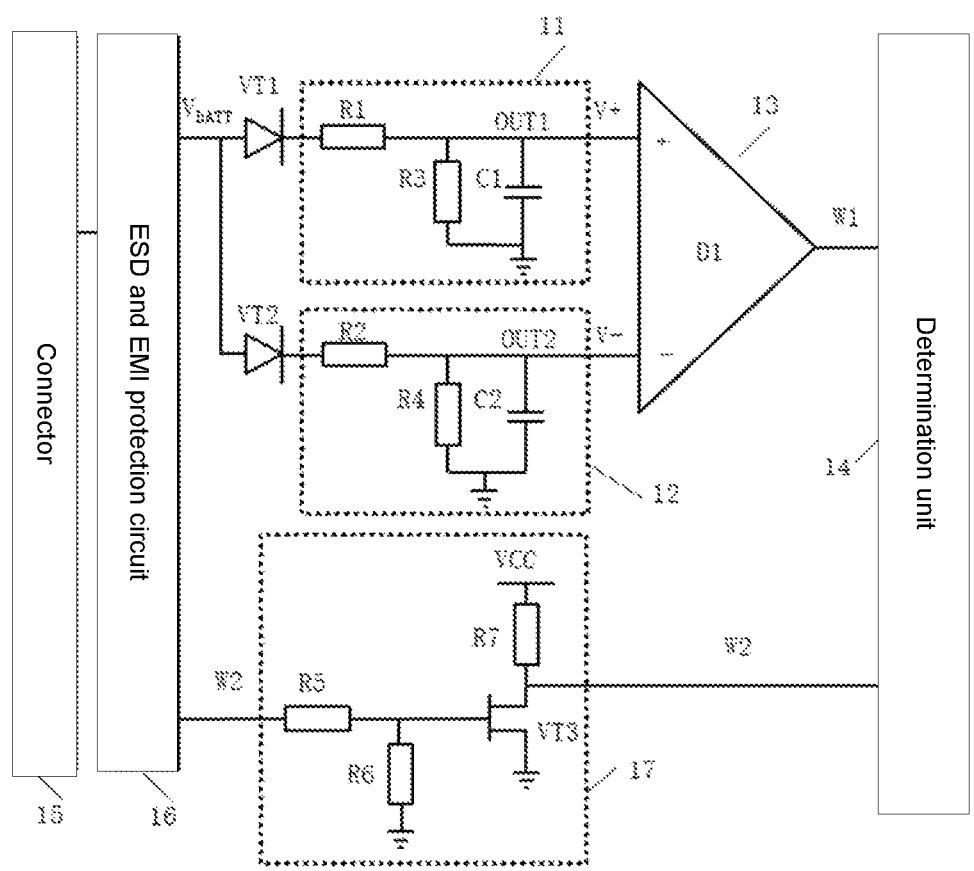
FIG. 7 is a schematic diagram of a detection circuit for instantaneous voltage drop according to a third embodiment of the present disclosure.

A third embodiment of the present disclosure relates to a detection circuit for instantaneous voltage drop. The third embodiment is substantially the same as the first or second embodiment, and the main difference lies in that: in the third embodiment of the present disclosure, as shown in FIG. 7, the determination unit 14 is further configured to receive an auxiliary detection signal W2 outputted by a system where the ignition device is located; and the determination unit 14 is configured to determine that the to-be-detected voltage VBATT drops instantaneously upon detection that the comparator 13 is inverted and the auxiliary detection signal W2 changes. The auxiliary detection signal W2 is a signal that changes before and after the ignition of the ignition device.

In this embodiment, the system where the ignition device is located is a vehicle system, and the auxiliary detection signal W2 may be, for example, a speed control signal of the vehicle. The magnitude of the voltage of the speed control signal does not match the magnitude of the voltage received by the determination unit 14, and thus in the example of FIG. 7, the detection circuit further comprises a voltage conversion unit 17; and the determination unit 14 receives the auxiliary detection signal W2 by means of the voltage conversion unit 17. However, it is not limited thereto, in other examples, if the selected auxiliary detection signal W2 matches the magnitude of the voltage of the determination unit 14, the determination unit 14 can directly receive the auxiliary detection signal W2. Furthermore, in other examples, the specific type of the auxiliary detection signal W2 may be selected according to actual application scenarios.

In one example, as shown in FIG. 7, the voltage conversion unit 17 comprises a third resistor R5, a fourth resistor R6, an electronic switch VT3, a pull-up resistor R7, and a pull-up power source VCC. Specifically, a first end of the third resistor R5 is used for receiving the auxiliary detection signal W2, a second end of the third resistor R5 is connected to a first end of the fourth resistor R6, and a second end of the fourth resistor R6 is grounded; a control end of the electronic switch VT3 is connected to the first end of the fourth resistor R6, a first conduction end of the electronic switch VT3 is connected to the pull-up power source VCC by means of the pull-up resistor R7 and is connected to the determination unit 14, and a second conduction end of the electronic switch VT3 is grounded. In this embodiment, the electronic switch VT3 is, for example, a triode, and the control end, the first conduction end and the second conduction end of the electronic switch VT3 are respectively a base electrode, a collector electrode and an emitter electrode of the triode.

In the case that the ignition is not performed, the system does not output the auxiliary detection signal W2, and at this time, the electronic switch VT3 is in an off state, but due to the effect of the pull-up resistor R7, the first conduction end of the electronic switch VT3 outputs a high-level signal to the determination unit 14; and this high-level signal can be regarded as an auxiliary detection signal W2 before the ignition. After the ignition, the system outputs an auxiliary detection signal W2, and at this time, the electronic switch VT3 is turned on, and the first conduction end of the electronic switch VT3 outputs a low-level signal, and this low-level signal can be regarded as an auxiliary detection signal W2 after the ignition.

Therefore, the determination unit 14 can determine whether the auxiliary detection signal W2 changes from a high level to a low level upon detection that the comparator 13 is inverted; and if it is detected that the auxiliary detection signal W2 changes from a high level to a low level, it is determined that the to-be-detected voltage drops instantaneously; and if it is not detected that the auxiliary detection signal W2 changes from a high level to a low level, it is determined that the to-be-detected voltage does not drop instantaneously. It should be noted that in other examples, it is not limited that the auxiliary detection signal W2 changing from a high level to a low level represents a situation after the ignition, and it can be determined according to the specific type of the auxiliary detection signal W2 and the specific structure of the voltage conversion unit 17, as long as the auxiliary detection signal W2 changes.

In this embodiment, detection of the auxiliary detection signal W2 is added to assist in determining whether the to-be-detected voltage drops instantaneously, which can increase the detection accuracy, and avoid misjudgment caused by external factors.

A fourth embodiment of the present disclosure relates to an on-board diagnostic system, comprising: the detection circuit for instantaneous voltage drop according to any one of the described embodiments.

It is easily found that this embodiment is a system embodiment corresponding to any one of the first to third embodiments, and this embodiment may be implemented in cooperation with any one of the first to third embodiments. Related technical details mentioned in any one of the first to third embodiments are still valid in this embodiment, and will not be repeated herein again to reduce repetition. Accordingly, the related technical details mentioned in the present embodiment can also be applied to any one of the first to third embodiments.

What is claimed is:

1. A detection circuit for instantaneous voltage drop, comprising: two RC circuits, a comparator and a determination unit;

each RC circuit comprises a first resistor, a second resistor and an energy storage capacitor; a first end of the first resistor is used for receiving a to-be-detected voltage, a second end of the first resistor is connected to a first end of the second resistor, and a second end of the second resistor is grounded; the energy storage capacitor is connected in parallel with the second resistor; the first end of the second resistor forms an output end of the RC circuit;

output ends of the two RC circuits are correspondingly connected to two input ends of the comparator respectively; an output end of the comparator is connected to the determination unit;

wherein in the two RC circuits, resistance ratios of the second resistors to the first resistors are different, capacitances of the energy storage capacitors are different, and the capacitance of the energy storage capacitor in the RC circuit with a larger resistance ratio of the second resistor to the first resistor is smaller; and the determination unit is configured to determine that the to-be-detected voltage drops instantaneously when it is at least detected that the comparator is inverted.

2. The detection circuit for instantaneous voltage drop according to claim 1, wherein the to-be-detected voltage is a voltage outputted by a battery power source supplying power to an ignition device;

wherein when the ignition device is ignited, the to-be-detected voltage drops instantaneously.

3. The detection circuit for instantaneous voltage drop according to claim 2, wherein the determination unit is further configured to receive an auxiliary detection signal outputted by a system where the ignition device is located; the auxiliary detection signal is a signal which changes before and after ignition of the ignition device;

wherein the determination unit is configured to determine that the to-be-detected voltage drops instantaneously upon detection that the comparator is inverted and the auxiliary detection signal changes.

4. The detection circuit for instantaneous voltage drop according to claim 1, wherein the detection circuit further comprises two diodes, and the first ends of the first resistors in the two RC circuits are correspondingly connected to the two diodes respectively, so as to receive the to-be-detected voltage by means of the diodes.

5. The detection circuit for instantaneous voltage drop according to claim 1, wherein the two RC circuits are respectively denoted as a first RC circuit and a second RC circuit;

the energy storage capacitor in the first RC circuit comprises a first sub-capacitor and a second sub-capacitor which are connected in parallel, and the capacitance of the first sub-capacitor is equal to the capacitance of the energy storage capacitor in the second RC circuit; and a resistance value of the second resistor in the first RC circuit is equal to a resistance value of the second resistor in the second RC circuit, and a resistance value of the first resistor in the first RC circuit is greater than a resistance value of the first resistor in the second RC circuit.

6. The detection circuit for instantaneous voltage drop according to claim 3, wherein the detection circuit further comprises a voltage conversion unit; and the determination unit receives the auxiliary detection signal by means of the voltage conversion unit.

7. The detection circuit for instantaneous voltage drop according to claim 6, wherein the voltage conversion unit comprises: a third resistor, a fourth resistor, an electronic switch, a pull-up resistor, and a pull-up power source;

a first end of the third resistor is used for receiving the auxiliary detection signal, a second end of the third resistor is connected to a first end of the fourth resistor, and a second end of the fourth resistor is grounded; and a control end of the electronic switch is connected to the first end of the fourth resistor, a first conduction end of the electronic switch is connected to the pull-up power source by means of the pull-up resistor and is connected to the determination unit, and a second conduction end of the electronic switch is grounded.

8. The detection circuit for instantaneous voltage drop according to claim 7, wherein the electronic switch is a triode.

9. The detection circuit for instantaneous voltage drop according to claim 1, wherein the determination unit is a main control chip of a system where the ignition device is located.

10. An on-board diagnostic system, comprising: the detection circuit for instantaneous voltage drop as claimed in claim 1.

11. An on-board diagnostic system, comprising: a detection circuit for instantaneous voltage drop as claimed in claim 2.

12. An on-board diagnostic system, comprising: a detection circuit for instantaneous voltage drop as claimed in claim 3.

13. An on-board diagnostic system, comprising: a detection circuit for instantaneous voltage drop as claimed in claim 4.

14. An on-board diagnostic system, comprising: a detection circuit for instantaneous voltage drop as claimed in claim 5.

15. An on-board diagnostic system, comprising: a detection circuit for instantaneous voltage drop as claimed in claim 6.

16. An on-board diagnostic system, comprising: a detection circuit for instantaneous voltage drop as claimed in claim 7.

17. An on-board diagnostic system, comprising: a detection circuit for instantaneous voltage drop as claimed in claim 8.

18. An on-board diagnostic system, comprising: a detection circuit for instantaneous voltage drop as claimed in claim 9.

* * * * *